United States Patent [19]

Mori

[11] Patent Number: 5,479,030
[45] Date of Patent: Dec. 26, 1995

[54] COMPOUND SEMICONDUCTOR DEVICE AND ELECTRIC POWER CONVERTING APPARATUS USING SUCH DEVICE

[75] Inventor: Mutsuhiro Mori, Hitachi, Japan

[73] Assignee: Hitachi, Ltd., Tokyo, Japan

[21] Appl. No.: 277,018

[22] Filed: Jul. 19, 1994

Related U.S. Application Data

[63] Continuation of Ser. No. 912,989, Jul. 14, 1992 now Pat. No. 5,357,120, filed Oct. 18, 1994.

[51] Int. Cl.$^6$ .......................... H01L 29/74; H01L 29/00; H01L 29/10
[52] U.S. Cl. .......................... 257/140; 252/137; 252/138; 252/139; 252/141
[58] Field of Search .......................... 257/139, 137, 257/138, 140, 141, 142, 143, 147, 38; 361/100; 357/38

[56] References Cited

U.S. PATENT DOCUMENTS

| | | | |
|---|---|---|---|
| 4,546,423 | 10/1985 | Seki | 367/100 |
| 4,959,703 | 10/1990 | Ogura et al. | 357/38 |
| 5,124,772 | 6/1992 | Hideshima et al. | 257/139 |
| 5,144,400 | 10/1992 | Bauer | 257/138 |

*Primary Examiner*—William L. Sikes
*Assistant Examiner*—Fetsum Abraham
*Attorney, Agent, or Firm*—Antonelli, Terry, Stout & Kraus

[57] ABSTRACT

A compound semiconductor device is provided which includes a thyristor region constructed by four continuous layers of p-n-p-n and an MOSFET region which is formed in the intermediate n layer of the thyristor region so as to be away from the intermediate p layer. The MOSFET is constructed by a p well layer, a source layer, and a drain layer. One main electrode of the device is in ohmic contact with the outside p layer of the thyristor region while the other main electrode is in ohmic contact with the source layer and well layer of the MOSFET region. An arrangement is provided for electrically connecting the outside n layer of the thyristor region and the drain layer of the MOSFET region. Also, a first insulating gate is formed on the well layer between the source layer and the drain layer of the MOSFET region and a second insulating gate is formed on the intermediate p layer of the thyristor region with the first and second insulating gates being electrically connected.

5 Claims, 10 Drawing Sheets

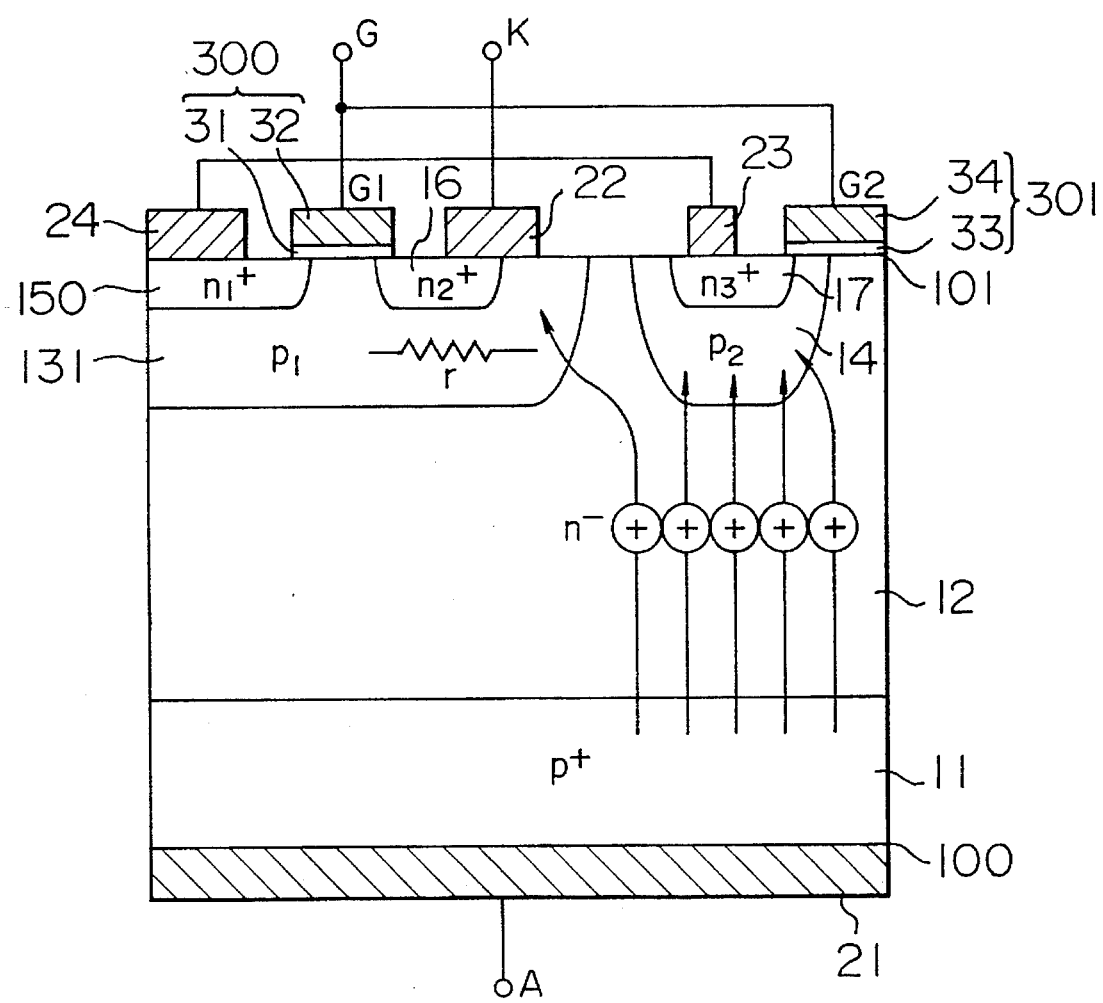

F I G. 13
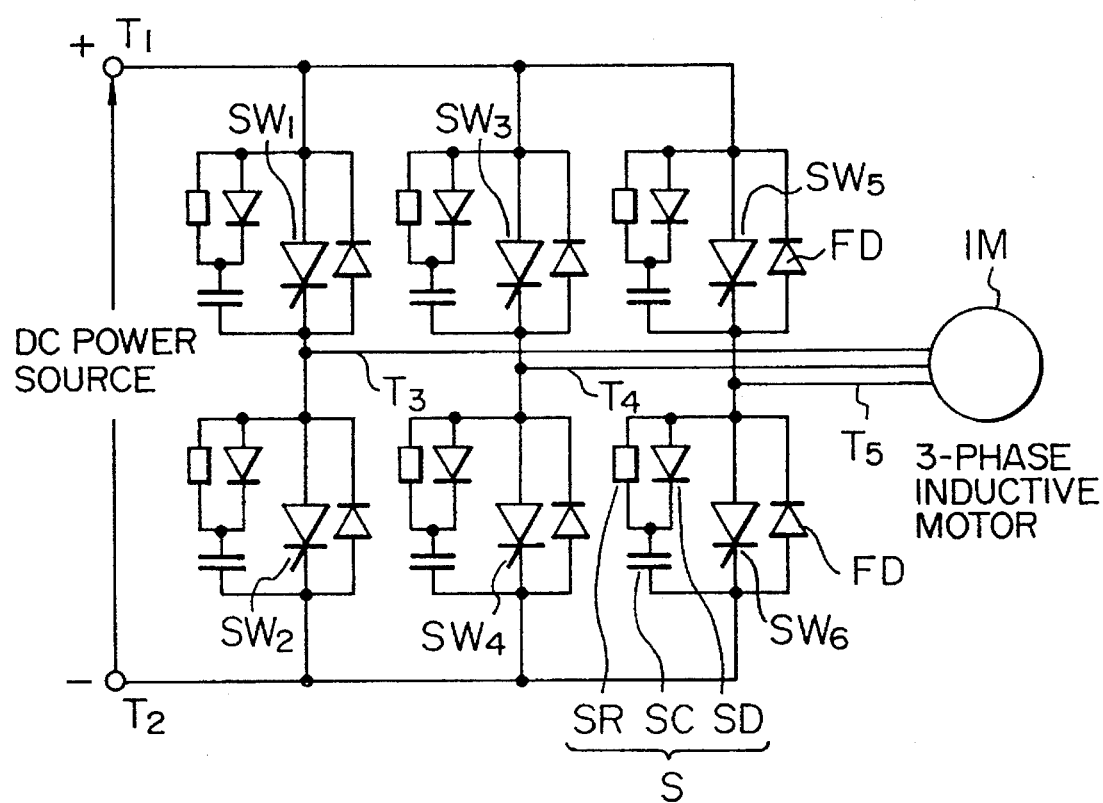

COMPOUND SEMICONDUCTOR DEVICE AND ELECTRIC POWER CONVERTING APPARATUS USING SUCH DEVICE

This application is a continuation of Ser. No. 07/912,989, now U.S. Pat. No. 5,357,120, filed Oct. 18, 1994 abandoned.

BACKGROUND OF THE INVENTION

The present invention relates to a compound semiconductor device which can be turned on/off by an MOS gate and which has saturation characteristics. It also relates to an electric power converting apparatus using such a device.

Hitherto, a semiconductor device in which a thyristor is controlled by an MOS gate and a current of the thyristor is controlled by saturation characteristics of an MOSFET has been disclosed in IEEE, "Electron Device Letters", Vol. 11, No. 2, pages 75 to 77, February, 1990. FIG. 9 shows the compound semiconductor device disclosed in FIG. 1 of the above paper. In the diagram, reference numeral 10 denotes a semiconductor substrate having a pair of main surfaces 100 and 101. A $p^+$ layer 11, an $n^-$ layer 12 formed on the $p^+$ layer 11, and a p layer 13 and a $p_1^+$ layer 130 which are formed on the $n^-$ layer 12 and whose surfaces are exposed to the main surface 101 are formed between the pair of main surfaces 100 and 101. An insulating gate 300 comprising an insulating film 31 and a gate electrode 32 are formed on the main surface 101. An $n_1^+$ layer 15 and an $n_2^+$ layer 16 are respectively independently formed in the main surface 101 while extending from the main surface 101 into the p layer 13 so as to reach the portions under the insulating gate 300. The $p_1^+$ layer 130 having a high carrier density is formed under the $n_2^+$ layer 16, thereby reducing a resistance r of the p layer. The $p_1^+$ layer 130 and the $n_2^+$ layer 16 are short-circuited by a cathode electrode 22. An anode electrode 21 is in ohmic contact with the main surface 100. The above compound semiconductor device has therein a thyristor comprising a pnp transistor which is constructed by the $p^+$ layer 11, $n^-$ layer 12, and p layer 13; and an npn transistor which is constructed by the $n^-$ layer 12, p layer 13, and $n_1^+$ layer 15. The device also has the insulating gate 300 and an n channel MOSFET comprising the $n_1^+$ layer 15, p layer 13, and $n_2^+$ layer 16. Further, the device has a parasitic thyristor, as a parasitic element, comprising the $n_2^+$ layer 16, $p_1^+$ layer 130, $n^-$ layer 12, and $p^+$ substrate 11. FIG. 10 shows an equivalent circuit of the compound semiconductor device of FIG. 9. The operation principle will now be described hereinbelow with reference to FIGS. 9 and 10. First, to turn on the compound semiconductor device, a negative potential is applied to a cathode terminal K and a positive potential is applied to an anode terminal A. The positive potential is applied from the cathode terminal K to a gate terminal G, thereby forming an inversion layer at the surface of the p layer 13 under the insulating gate. Thus, the $n_1^+$ layer 15 and $n_2^+$ layer 16 are short-circuited.

In such a state, a base current (hole current ⊕) is further supplied from the cathode terminal K to the p layer 13. A potential difference occurs between both edges of the resistor of the p layer 13 and the $p_1^+$ layer 130 by the hole current. When the potential difference exceeds a diffusion potential (about 0.7 V at a room temperature in case of silicon) of the p layer 13 and $n_1^+$ layer 15, electrons ⊖ are implanted from the $n_1^+$ layer 15 into the p layer 13. When the electrons ⊖ pass through the $n^-$ layer 12 and flow into the $p^+$ layer 11, a great number of holes ⊕ are implanted from the $p^+$ layer 11 into the $n^-$ layer 12. When the hole current reaches the p layer 13 and flows into the cathode electrode 22, the electrons ⊖ are further implanted from the $n_1^+$ layer 15 and the thyristor comprising the $n_1^+$ layer 15, p layer 13, $n^-$ layer 12, and $p^+$ layer 11 is ignited (latched up), so that the compound semiconductor device is turned on.

To turn off the compound semiconductor device, it is sufficient to eliminate the potential at the gate terminal G. For instance, by short-circuiting the gate terminal G and the cathode terminal K, the inversion layer on the surface of the p layer 13 under the insulating gate is extinguished and the supply of the electrons ⊖ which are implanted from the $n_1^+$ layer 15 into the p layer 13 is shut off. Consequently, the implantation of the holes ⊕ from the $p^+$ layer 11 is also stopped and the compound semiconductor device is turned off.

It is a feature of such a compound semiconductor device that by using the thyristor operation, a great amount of electrons ⊖ and holes ⊕ are implanted into the $n^-$ layer 12 of a high resistance to thereby reduce the resistance of the layer 12, and a loss of resistance upon conduction which occurs in the compound semiconductor device can be significantly decreased. Moreover, (although a gate structure to supply the hole current to the p layer 13 at the time of turn-on is not described in detail in the foregoing paper), there are features such that the device can be easily turned on or off by applying or eliminating the potential to the insulating gate 300, eliminating the necessity for a large amount of current to be supplied or pulled out by the gate, for instance, which is normally required for a conventional gate turn-off (GTO) thyristor. As such, the gate circuit is greatly simplified. Further, the electrons ⊖ which are implanted from the $n_1^+$ layer 15 can be limited by using the output characteristics (called saturation characteristics) in which the insulating gate 300 and the MOSFET comprising the $n_1^+$ layer 15, p layer 13 ($p_1^+$ layer 130), and $n_2^+$ layer 16 are saturated. The current limiting action due to the saturation characteristics can be provided in spite of the fact that the compound semiconductor device executes the operation of the thyristor. In the power semiconductor device, ordinarily, the structure of FIG. 9 is used as one cell and a large number of such cells (for example, hundreds of cells to tens of thousands of cells) are integrated and are operated in parallel. In this instance, if each cell has the current limiting action, the current is not concentrated to one cell and each cell uniformly bears the share of the current, so that a breakdown of the power semiconductor device due to the current concentration can be prevented. Since the compound semiconductor device has the current limiting action in spite of the fact that the device executes the thyristor operation, a uniform current flow without current concentration can be realized in the ON state. In addition, even at the time of turn-off, the current of each cell can be uniformly reduced and a large current can be also easily shut off.

The above compound semiconductor device, however, has a problem such that it is difficult to implant the electrons ⊖ from the $n_1^+$ layer 15 and to ignite. That is, although the $n_1^+$ layer 15 is short-circuited to the cathode electrode 22 through the inversion layer of the insulating gate 300 and the $n_2^+$ layer 16, the resistance of the inversion layer is so large as to be a few kΩ as a sheet resistance. Such a resistance obstructs the current supply of the electrons ⊖ which are implanted from the $n_1^+$ layer 15. In other words, when a potential difference between the p layer 13 and the $n_1^+$ layer 15 reaches the diffusion potential or higher and the implantation of the ions ⊖ from the $n_1^+$ layer 15 is started, the potential of the $n_1^+$ layer 15 becomes higher than that of the $n_2^+$ layer 16 due to the electron current and the resistance of the inversion layer. Thus, the potential difference between the $n_1^+$ layer 15 and the p layer 13 decreases, the implantation of the electrons $\ominus$ from the $n_1^+$ layer is suppressed, and it becomes difficult to ignite. To prevent such a problem, there is a method of increasing the resistance R of the p layer 13. However, when a carrier density of the p layer 13 is reduced and the p layer is made thin in order to increase the resistance R, a new problem is created that the depletion layer extending in the p layer 13 reaches the $n_1^+$ layer 15 and punch through occurs, thereby deteriorating the withstanding voltage. To prevent such a problem, a method of increasing the resistance R by extending the $n_1^+$ layer 15 in such a direction as to be away from the cathode electrode 22 is considered. In such a case, another problem occurs. Namely, there is a problem that latch-up can be easily occur in the $n_2^+$ layer 16, $p_1^+$ layer 130, $n^-$ layer 12, and $p^+$ layer 11 which exist as a parasitic thyristor. An extremely large amount of holes $\oplus$ which reach from the $p^+$ layer 11 and an extremely large amount of holes $\oplus$ generated so as to satisfy the neutral conditions of the electrons $\ominus$ which had been implanted from the $n_1^+$ layer 15 exist in the p layer 13 because the $p^+$ layer 11 is wide due to the foregoing reasons. All of such holes $\oplus$ pass through the $p_1^+$ layer 130 and flow into the cathode electrode 22. In this instance, although the $p_1^+$ layer 130 has a low resistance r due to a high carrier density, since a hole current which flows into the layer 130 is large, a large potential difference occurs across the resistor r. When such a potential difference is equal to or higher than the diffusion potential of the $p_1^+$ layer 130 and $n_2^+$ layer 16, the parasitic thyristor latches up. Once the parasitic thyristor latches up, the compound semiconductor device cannot be turned off by the insulating gate 300 any more and the current continuously flows. Finally, the apparatus is broken by the current and a Joule heat which is generated due to the conduction loss.

In the conventional compound semiconductor device as mentioned above, the large resistance of the inversion layer and the operation of the parasitic thyristor has not been adequately considered. Therefore, the device is difficult to ignite, and is easily broken down.

SUMMARY OF THE INVENTION

It is an object of the invention to provide an improved compound semiconductor device which can be easily ignite and it is difficult for a parasitic thyristor to operate and, wherein the device is turned on or off by an insulating gate and has a current limiting action.

Another object of the invention is to provide an electric power converting apparatus using a compound semiconductor device.

It is a feature of a compound semiconductor device of the invention to accomplish the above object that an intermediate p layer in a thyristor region and a p type well layer which is formed in an intermediate n layer of the thyristor region and in which the MOSFET region is formed, are separated by the intermediate n layer of the thyristor region, one main electrode comes into ohmic contact with a p layer on the outside of the thyristor region, the other main electrode comes into ohmic contact with a source layer and a well layer in the MOSFET region, an n layer on the outside of the thyristor region and a drain layer of the MOSFET region are electrically connected, a first insulating gate electrode is provided on the well layer located between the source layer and the drain layer of the MOSFET region, a second insulating gate electrode is formed on the surface of the intermediate p layer of the thyristor region, and the first and second insulating gate electrodes are electrically connected.

It is a feature of an electric power converting apparatus of the invention to accomplish the above object that the compound semiconductor device of the invention is used as a switching device constructing an inverter or a converter.

In the compound semiconductor device with the above construction, by separating the intermediate p layer of the thyristor region and the p type well layer of the MOSFET region by the intermediate n layer of the thyristor region, a hole current in the intermediate p layer of the thyristor region flows into an $n^+$ layer on the outside of the thyristor region and electrons can be smoothly implanted from the outside $n^+$ layer, so that the device can easily ignite. On the other hand, most of the hole current of the thyristor region directly flows into the second main electrode, a very small amount of hole current passes through the parasitic thyristor region, and a malfunction of the parasitic thyristor due to a latch-up doesn't occur. Further, most of the current flowing between the first and second main electrodes flows through a serial circuit of the thyristor region and MOSFET region, so that an apparatus having a current limiting action can be obtained.

Furthermore, according to the electric power converting apparatus with such a construction, since the compound semiconductor device of the invention having a current limiting action is used as a switching device, the switching device can be directly connected in parallel in accordance with a current supplying capacitance, and a large capacity can be fairly easily realized.

BRIEF DESCRIPTION OF THE DRAWINGS

FIG. 3 is a schematic cross sectional view showing another embodiment of a compound semiconductor device of the invention;

FIG. 13 is a circuit diagram showing an embodiment of an electric power converting apparatus using the compound semiconductor device of the invention.

DESCRIPTION OF THE PREFERRED EMBODIMENTS

Figure 9:
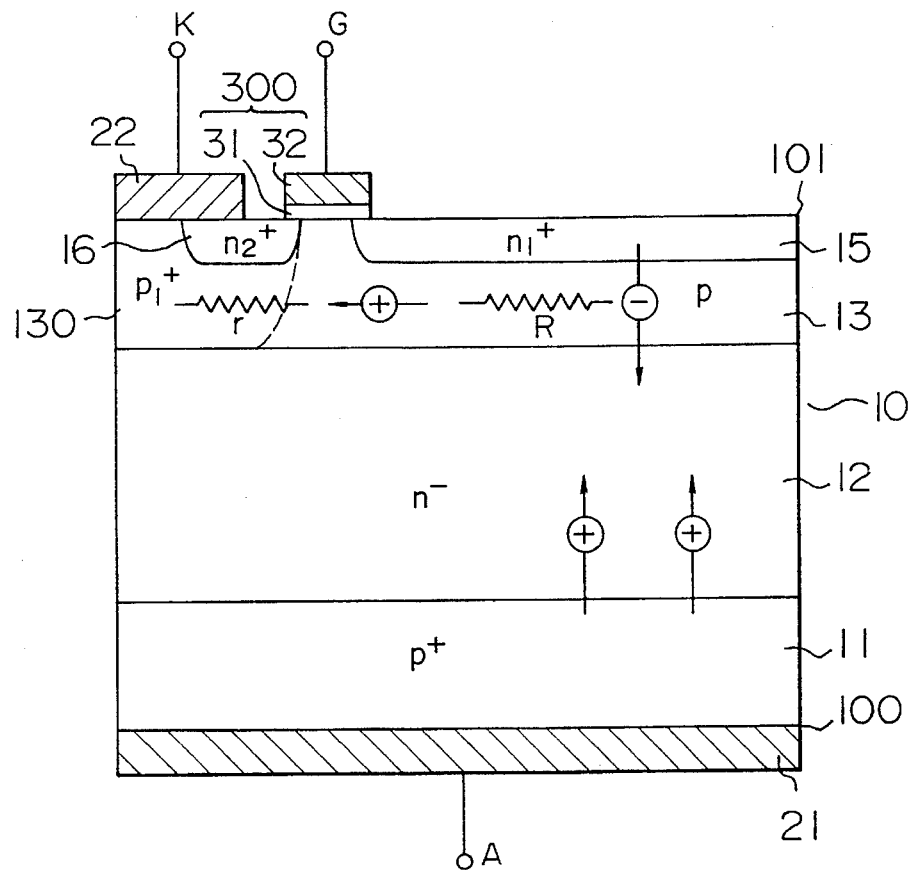
FIG. 9 is a schematic cross sectional view of a conventional compound semiconductor device.
Figure 10:
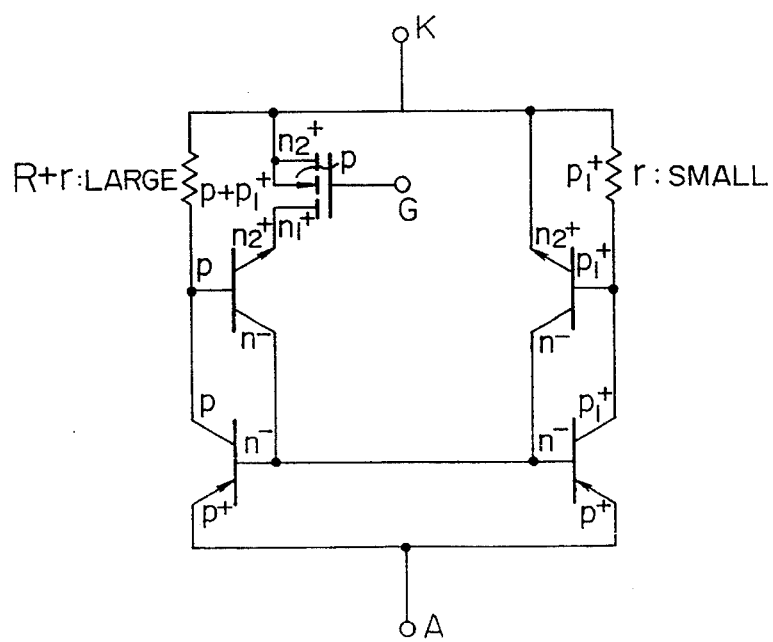
FIG. 10 is an equivalent circuit diagram of the device shown in FIG. 9.

An embodiment of the invention will be described hereinbelow with reference to FIG. 1. FIG. 2 is an equivalent circuit of FIG. 1. The embodiment of FIGS. 1 and 2 differs from the device shown in FIG. 9 with respect to a point that the p layer 13 in FIG. 9 is divided into a $P_1$ layer (well layer of the MOSFET) 131 and a $P_2$ layer (intermediate layer of the thyristor) 14 by the $n^-$ layer 12 and an $n_1^+$ layer 150 and an $n_3^+$ layer 17 are provided for the $P_1$ layer 131 and $P_2$ layer 14, respectively, and a point that the device has an MOSFET comprising an insulating gate $G_2$ (an insulating film 33 and a gate electrode 34) 301 which lies over an $n_3^+$ layer 17, the $P_2$ layer 14, and the $n^-$ layer 12. The operation principle of the compound semiconductor device of the invention will now be described. First, to turn on the compound semiconductor device, a negative potential is applied to the cathode electrode 22 and a positive potential is applied to the anode electrode 21 and, in this state, a positive potential is applied from the cathode electrode 22 to the insulating gate $G_1$ 300 and insulating gate $G_2$ 301. Thus, an inversion layer (channel) is formed on the surface of the $P_1$ layer 131 under the insulating gate $G_1$ 300, an inversion layer (channel) is formed on the surface of the $P_2$ layer 14 under the insulating gate $G_2$ 301, and the $n^-$ layer 12 is short-circuited to the cathode electrode 22. Electrons $\ominus$ consequently flow from the cathode electrode 22 to the $n^-$ layer 12, thereby promoting the implantation of the hole $\oplus$ from the $p^+$ layer 11. Most of the holes $\oplus$ reach the $P_2$ layer 14 and the potential of the $P_2$ layer 14 is raised to the positive potential, thereby causing the implantation of the electrons $\ominus$ from the $n_3^+$ layer 17. Thus, the $n^-$ layer 12 of a high resistance is conductivity modulated by the holes $\oplus$ and electrons $\ominus$, and a large current starts to flow. On the other hand, to turn off the compound semiconductor device, it is sufficient to eliminate the potentials of the insulating gates $G_1$ 300 and $G_2$ 301 and to extinguish the inversion layers of the $P_1$ layer 131 and $P_2$ layer 14. The implantation of the electrons $\ominus$ from the $n_3^+$ layer 17 is shut off by the insulating gate $G_1$ 300 and the flow of the electrons $\ominus$ flowing into the $n^-$ layer 12 through the inversion layer is also shut off by the insulating gate $G_2$ 301. Thus, the implantation of the holes $\oplus$ from the $p^+$ layer 11 is also stopped and the compound semiconductor device is turned off. According to the embodiment, since the $n^-$ layer 12 exists between the $P_2$ layer 14 and the $P_1$ layer 131, it is difficult for the holes $\oplus$ which have reached the $P_2$ layer 14 to directly flow into the $P_1$ layer 131, so that the holes $\oplus$ from the $p^+$ layer 11 are sufficiently implanted into the $n_3^+$ layer 17, thereby promoting the implantation of the electrons $\ominus$ from the $n_3^+$ layer. Moreover, by forming the $P_2$ layer 14 so as to be perfectly separated from the $P_1$ layer 131, the potential of the $p_2$ layer 14 can be raised to the positive potential by the potential of the anode electrode 21 without fixing the potential of the $P_2$ layer 14 to the potential of the cathode electrode 22. Thus, the $p_2$ layer 14 and the $n_3^+$ layer 16 are forwardly biased, the implantation of the electrons $\ominus$ from the $n_3^+$ layer 16 easily occurs, and the compound semiconductor device can easily ignite. By providing the insulating gate $G_2$ 301, the insulating gates $G_1$ 300 and $G_2$ 301 can be simultaneously turned on by applying the same positive potential as that of the insulating gate $G_1$ 300. The insulating gates $G_1$ and $G_2$, accordingly, can be also formed by the same insulating gate.

Figure 1:
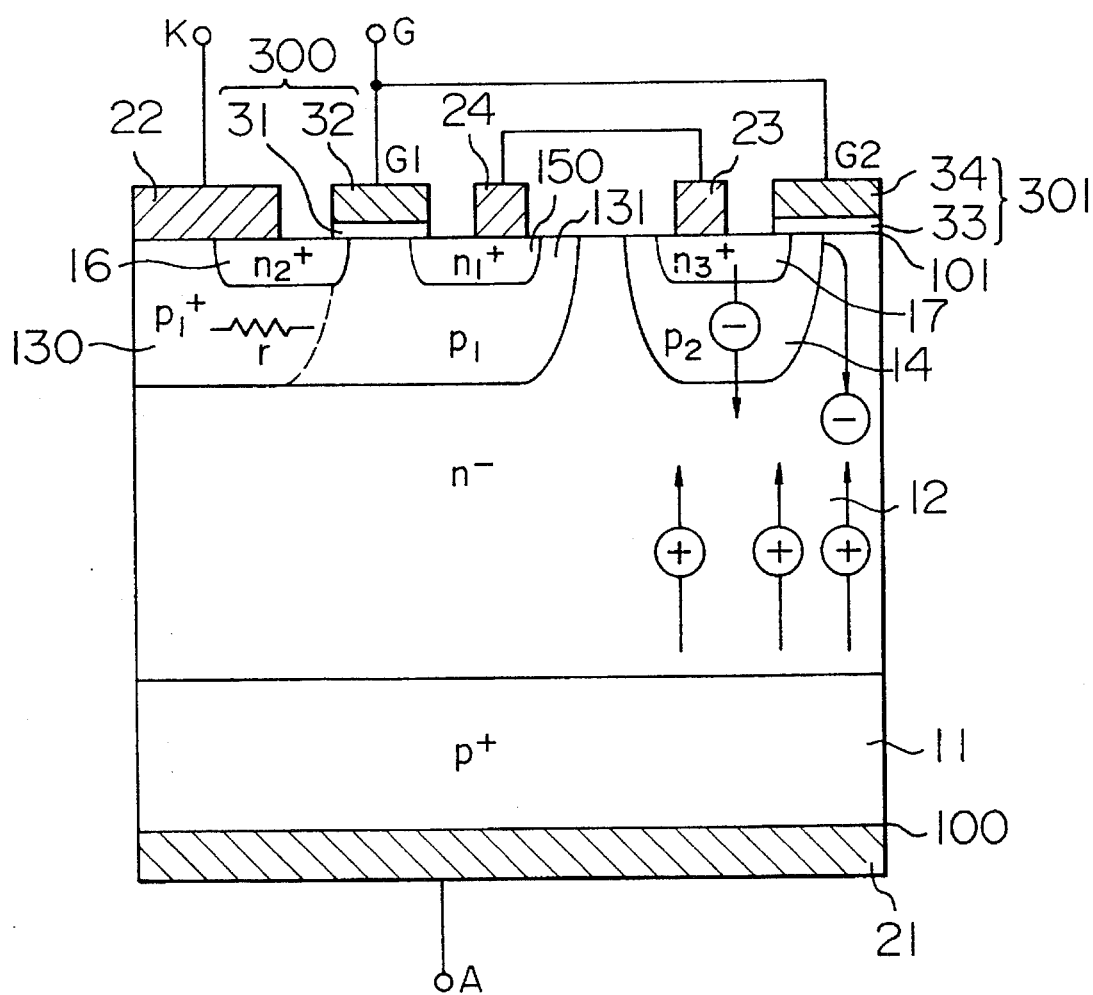
FIG. 1 is a schematic cross sectional view showing an embodiment of a compound semiconductor device of the invention.
Figure 2:
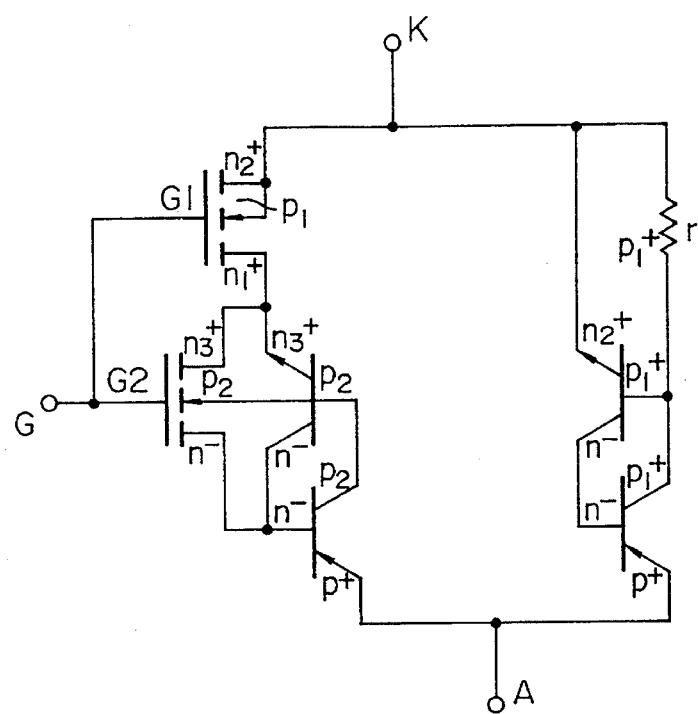
FIG. 2 is an equivalent circuit diagram of the device shown in FIG. 1.
Figure 4:
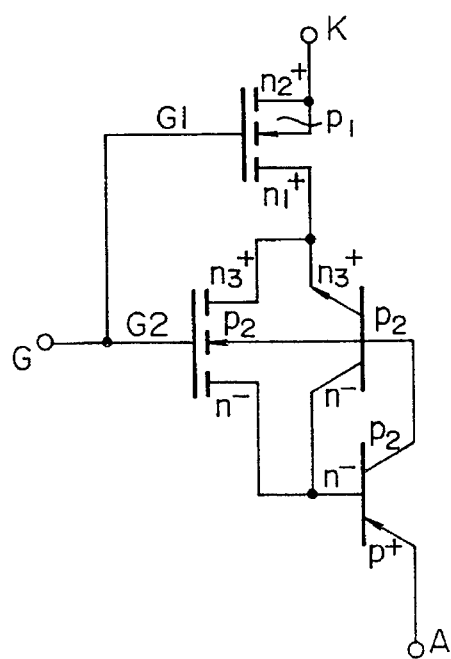
FIG. 4 is an equivalent circuit diagram of the device shown in FIG. 3.

FIG. 3 shows another embodiment of the invention and differs from FIG. 1 with respect to a point that the region in which an $n_2^+$ layer 16 and the $P_1$ layer 131 are short-circuited by the cathode electrode 22 is provided on the thyristor region side of the $n_3^+$ layer 17, $p_2$ layer 14, $n^-$ layer 12, and $p^+$ layer 11 rather than the $n_1^+$ layer 150 and a point that the region in which the cathode electrode 22 is come into contact with the $p_1^+$ layer 131 is provided on the thyristor region side rather than the region in which the cathode electrode 22 is come into contact with the $n_2^+$ layer 16. Consequently, the parasitic thyristor existing due to the resistor r in FIGS. 1 and 2 can be eliminated. That is, even if a part of the holes $\oplus$ which have flowed from the $p^+$ layer 11 flow into the $P_1$ layer 131, they don't pass through the resistor r but are directly absorbed to the cathode electrode 22. Therefore, the equivalent circuit of FIG. 3 doesn't include the parasitic thyristor as shown in FIG. 4. Further, by making the $n_1^+$ layer 150 away from the thyristor region, there is also an effect such that the operation of the parasitic thyristor comprising an $n_1$ layer 150, the $P_1$ layer 131, the $n^-$ layer 12, and the $p^+$ layer 11 can be prevented.

Figure 5:
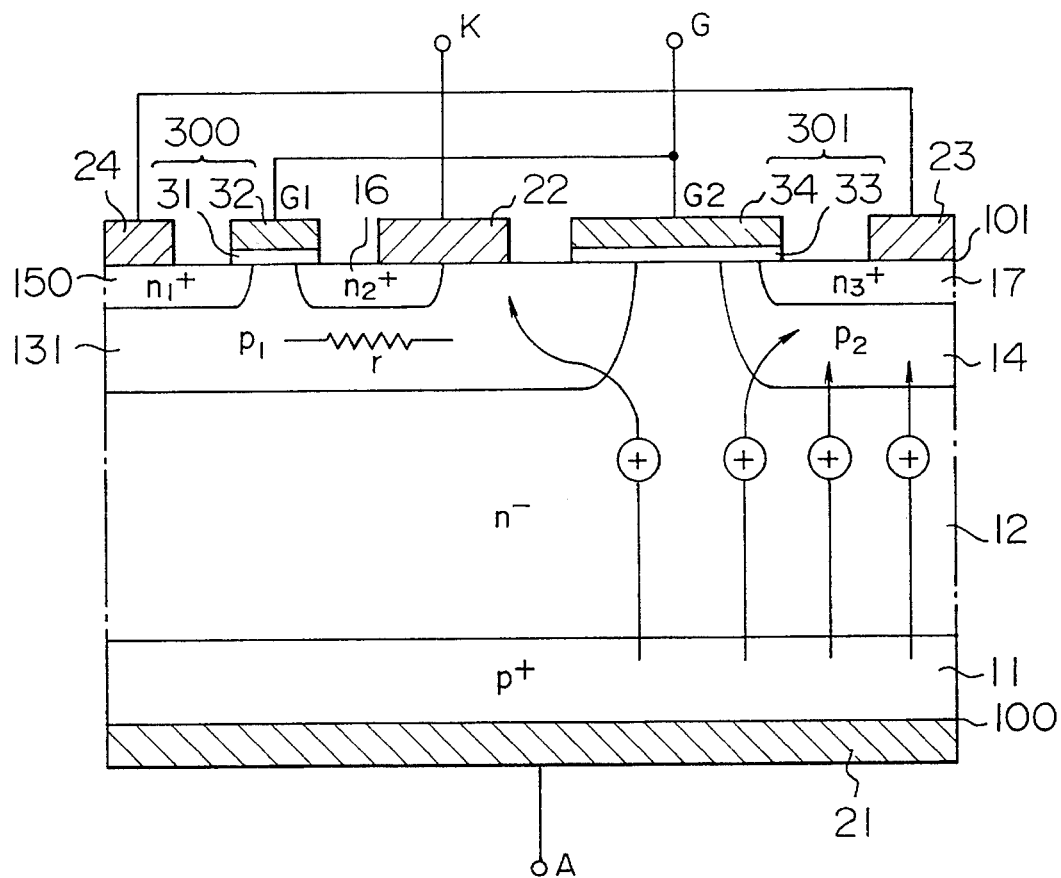
FIG. 5 is a schematic cross sectional view showing still another embodiment of a compound semiconductor device of the invention.
Figure 6:
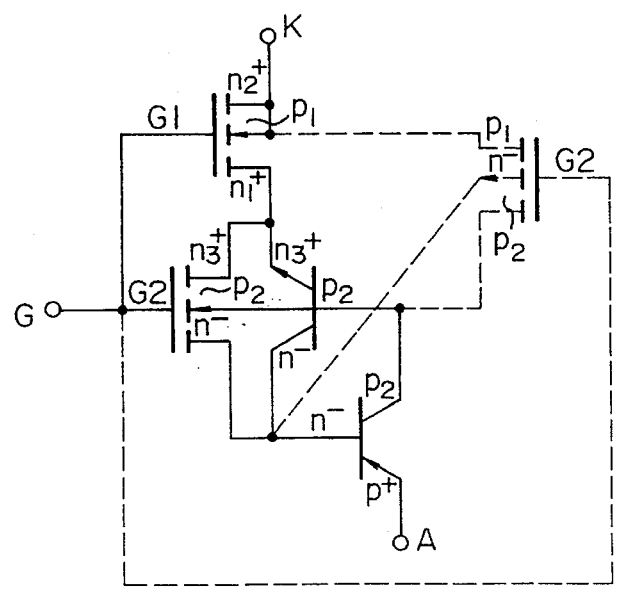
FIG. 6 is an equivalent circuit diagram of the device shown in FIG. 5.

FIG. 5 shows further another embodiment of the invention and differs from FIGS. 1 and 3 with respect to a point that the insulating gate $G_2$ 301 lies over not only the $n_3^+$ layer 17, $P_2$ layer 14, and $n^-$ layer 12 but also the $P_1$ layer 131 and a point that the insulating gate $G_2$ 301 is provided on the $P_1$ layer 131 side. Due to this, in the $P_2$ layer 14 whose potential is unspecified in the OFF state, by applying a negative potential to the insulating gate $G_2$ 301 for the cathode electrode 22, an inversion layer is formed on the surface of the $n^-$ layer 12 under the insulating gate $G_2$ 301, so that the $P_1$ layer 131 and the $P_2$ layer 14 can be short-circuited. Thus, a high withstanding voltage of the thyristor region can be realized. Namely, when the potential of the $P_2$ layer 14 is unspecified in the OFF state, the $P_2$ layer 14 is set to the positive potential due to an influence by the anode electrode 21, the $P_2$ layer 14 and $n_3^+$ layer 16 are set into the forward bias state, and the $n_1^+$ layer 150 and $P_1$ layer 131 are set into the reverse bias state. Generally, in the lateral type MOSFET region having the insulating gate $G_1$, in order to reduce a channel resistance, the $n_1^+$ layer 150 and $n_2^+$ layer 16 are formed so as to be close to each other at a distance of about a few μm or less, so that the withstanding voltage is low. Therefore, the withstanding voltage of the thyristor region is small and there is a fear such that the withstanding voltage of the compound semiconductor device is also small. According to the embodiment, since the potential of the $P_2$ layer 14 is fixed to the potential of the $P_1$ layer 131, the withstanding voltage of the thyristor region doesn't decrease and a high withstanding voltage of the compound semiconductor device can be realized. A similar effect is also obviously obtained even if the $P_1$ layer 131 and $P_2$ layer 14 are short-circuited in a peripheral portion to such an extent that no influence is exerted on an igniting sensitivity. Further, there is also an advantage such that an n channel MOSFET including the insulating gate $G_2$ 301 which lies over the $n_3^+$ layer 17, $P_2$ layer 14, and $n^-$ layer 12 is provided on the $P_1$ layer 131 side, so that a p channel MOSFET comprising the $P_2$ layer 14, $n^-$ layer 12, and $P_1$ layer 131 and the foregoing n channel MOSFET can be integratedly formed. FIG. 6 shows an equivalent circuit of FIG. 5. The p channel MOSFET shown by a broken line is a circuit added to FIG. 4.

Figure 7:
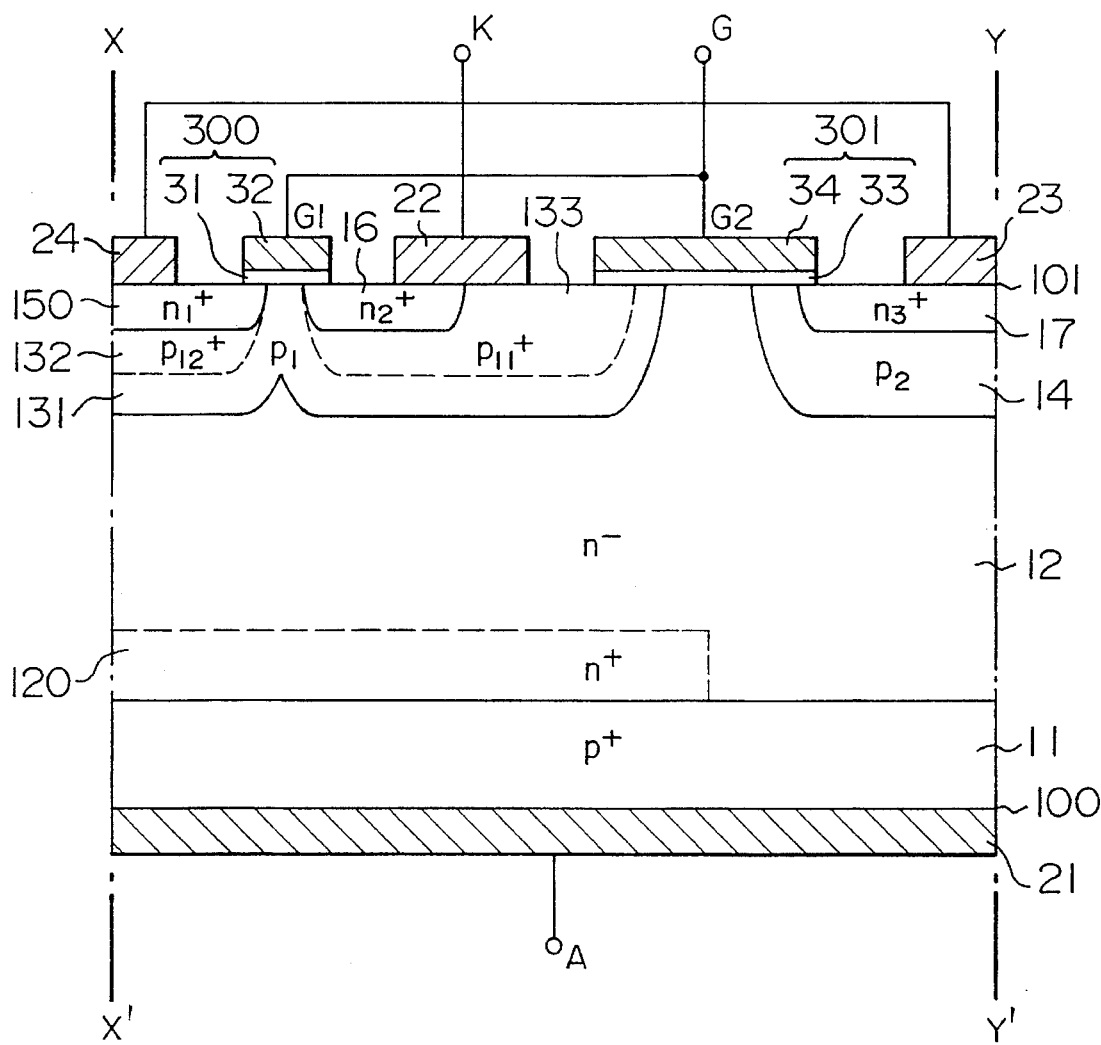
FIG. 7 is a schematic cross sectional view showing further another embodiment of a compound semiconductor device of the invention.

FIG. 7 shows further another embodiment of the invention and differs from FIG. 5 with respect to a point that first, in order to reduce a short-circuit resistance of the $P_1$ layer 131 under the $n_2^+$ layer 16, a $P_{11}^+$ layer 133 having a carrier density higher than that of the $P_1$ layer 131 is provided. Thus, a malfunction due to a latch-up of a parasitic thyristor comprising the $n_2^+$ layer 16, $p_{11}^+$ layer 133 ($p_1$ layer 131), $n^-$ layer 12, and $p^+$ layer 11 can be further certainly prevented. Among the holes ⊕ implanted from the p$^+$ layer 11, the components which directly reach the P$_1$ layer 131 can be led to the cathode electrode 22 through a low resistance path. On the other hand, according to the embodiment of FIG. 7, a p$_{12}^+$ layer 132 of a carrier density higher than that of the P$_1$ layer 131 is provided in the P$_1$ layer 131 under the n$_1$ layer 150, so that a latch-up of a parasitic thyristor comprising the n$_1$ layer 150, P$_{12}^+$ layer 132 (P$_1$ layer 131), n$^-$ layer 12, and p$^+$ layer 11 can be also prevented. Although the p$_{11}^+$ layer 133 and the p$_{12}^+$ layer 132 can be also obviously integratedly formed, in such a case, a carrier density of the surface of the P$_1$ layer 131 under the insulating gate 300 needs to be controlled to, for example, about $10^{16}$ to $10^{18}$ cm$^{-3}$ so as to form the inversion layer. With such a structure, the P$_{12}^+$ layer 132 and the P$_{11}^+$ layer 133 can be continuous in a region under the insulating gate G$_1$ 300 and a malfunction due to the latch-up by the parasitic thyristor can be further prevented. The embodiment of FIG. 7 has a feature with respect to a point that an n$^+$ layer 120 to suppress the implantation of the holes ⊕ from the p$^+$ layer 11 is provided between the p$^+$ layer 11 and the n$^-$ layer 12 in regions below the n$_1^+$ layer 150 and n$_2^+$ layer 16 in which the parasitic thyristor exists. Consequently, the implantation of the holes ⊕ into the parasitic thyristor region can be shut off and the operation without a parasitic effect can be performed.

It is also obviously possible to consider modifications as extensions of the conventional technique such that an n buffer layer (not shown) is provided between the p$^+$ layer 11 and the n$^-$ layer 12 and a punch through of a depletion layer and a thin film of the n$^-$ layer 12 are realized, and the like. Further, when the n$_1^+$ layer 150, P$_{12}^+$ layer 132, n$_2^+$ layer 16, P$_{11}^+$ layer 133, P$_1$ layer 131, n$_3^+$ layer 17, and P$_2$ layer 14 are formed in a self aligning manner by using the insulating gates G$_1$ and G$_2$ as masks, a threshold voltage and a structure of an MOS gate can be realized with a good fidelity.

Figure 8:
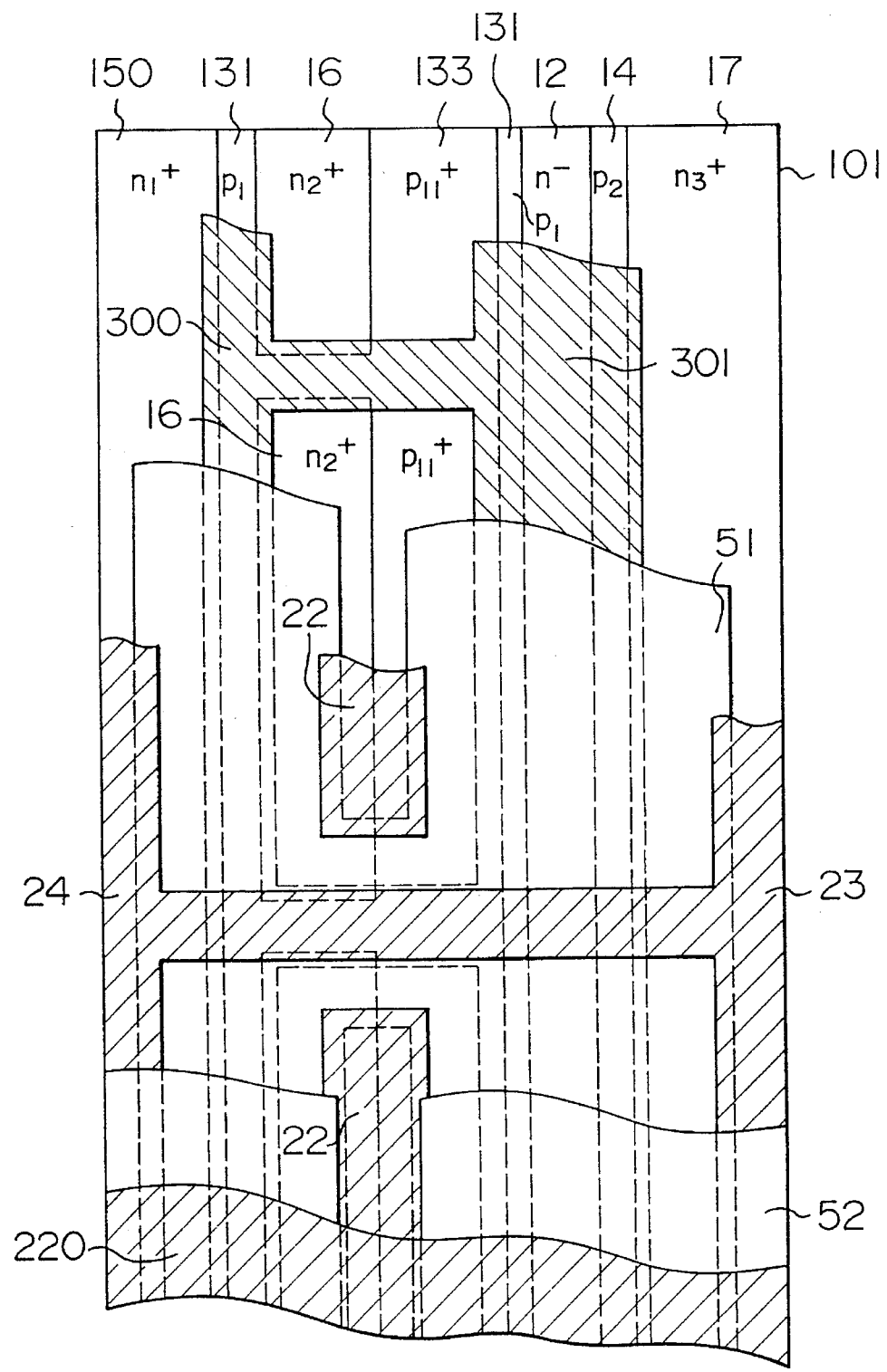
FIG. 8 is a plan view of the device shown in FIG. 7.

FIG. 8 shows a plan view of FIG. 7. The surface 101 of the semiconductor layer is shown in the upper portion in FIG. 8. The lower portion of FIG. 8 shows a state in which the insulating films and electrodes formed on/over the surface 101 are overlapped. The n$_1^+$ layer 150, P$_1$ layer 131, n$_2^+$ layer 16, p$_{11}^+$ layer 133, n$^-$ layer 12, p$_2$ layer 14, and n$_3^+$ layer 17 are shown in a state in which they are exposed to the surface 101 of the semiconductor substrate. The insulating gates 300 and 301 are formed on the surface 101 by forming SiO$_2$ having a thickness of about 0.1 μm as an insulating film and by forming polysilicon having a thickness of about 0.4 μm as a gate electrode. Both of them are coupled by polysilicon. An insulating film 51 having a thickness of about 1 μm is further deposited on them by using, for example, SiO$_2$, SiN, PSG, or the like. The insulating film 51 is properly eliminated so as to expose the n$_1^+$ layer 150, n$_2^+$ layer 16, p$_{11}^+$ layer 133, and n$_3^+$ layer 17. Further, electrodes 22, 23, and 24 are formed on the insulating film 51. The electrodes 23 and 24 are short-circuited. An insulating film 52 is further formed on the electrodes and a cathode electrode 220 is taken out from a partially eliminated portion of the insulating film 52.

As mentioned above, although the layers of the invention have an elongated stripe-shaped plane structure, they can also have a circular structure by using X–X' and Y–Y' in FIG. 7 as centers.

In a power semiconductor device, by integrating a number of cells of such compound semiconductor devices as shown in FIG. 8, a large current is taken out. For example, in FIG. 8, a large number of unit cells (tens of unit cells to tens of thousand unit cells or more) are integrated symmetrically with respect to the line X–X' or Y–Y'.

Figure 11:
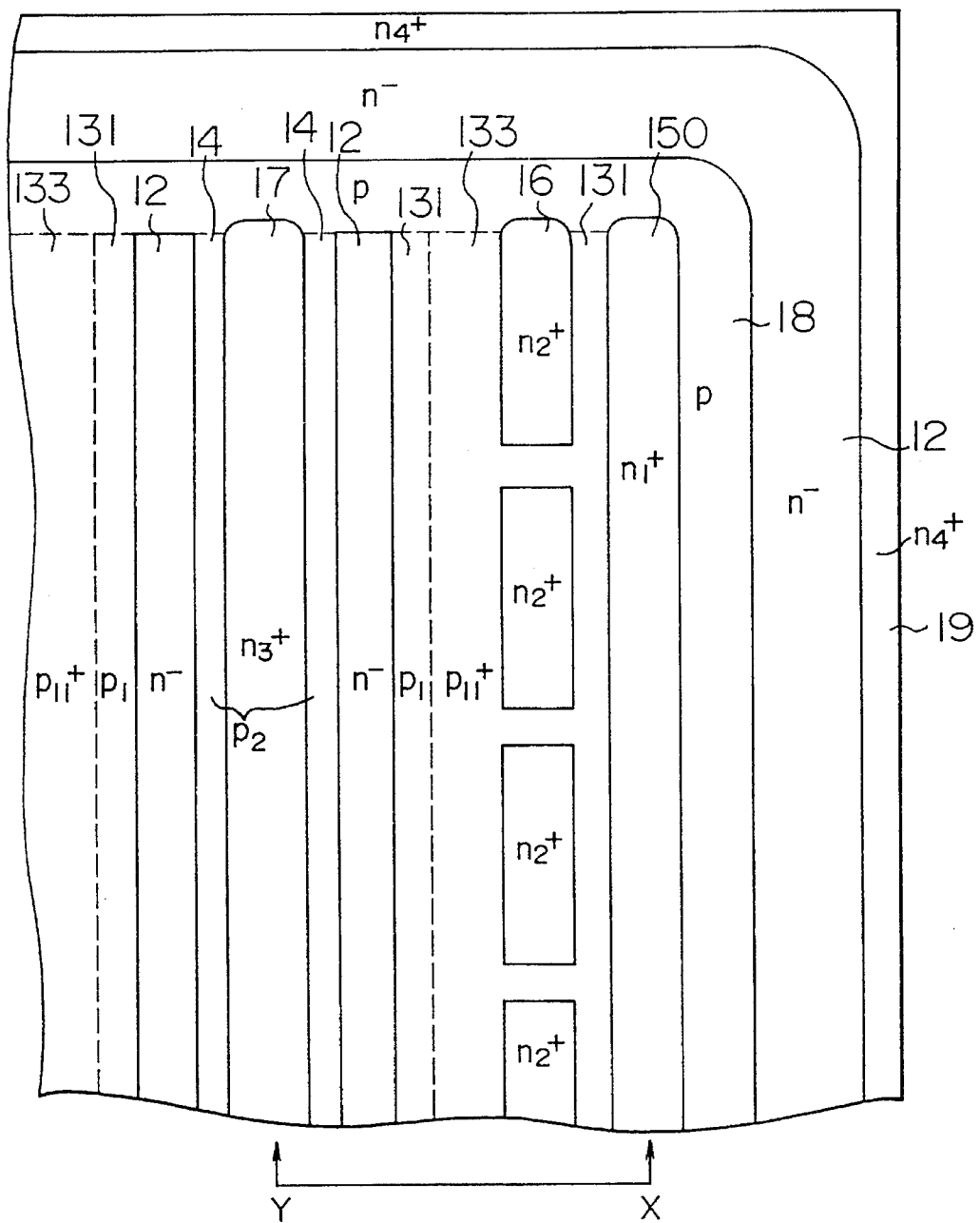
FIG. 11 is a plan view in the case where the devices shown in FIGS. 7 and 8 are integrated.

FIG. 11 shows a peripheral structure of a semiconductor device in the case where the plane structure of FIG. 8 is further integrated. FIG. 11 shows an example of a pattern of semiconductor regions exposed to the main surface 101. An X-Y plane pattern is repeated and a p layer 18 is formed around the integrated unit cell. The n$^-$ layer 12 is exposed on the peripheral side of the p layer 18. An n$^+$ layer 19 is formed at the most peripheral portion. The p layer 18 is short-circuited to the cathode electrode and has a structure to block a high voltage by a termination structure such as a field plate or the like provided on the n$^-$ layer 12. The n$^+$ layer 19 functions as a channel stopper to stop the extension of the depletion layer. The p layer 18 short-circuits the P$_1$ layer 131, p$_{11}^+$ layer 133, and p$_2$ layer 14 in the peripheral regions and stabilizes the potential of each layer to the cathode potential and can prevent an erroneous ignition by a sudden voltage change dv/dt or the like. By forming the cathode electrode 22 (FIG. 8) to the p layer 18 and by further short-circuiting another cathode electrode 22 in the central portion by the electrode 22, the hole current ⊕ accumulated in the peripheral termination region can be promptly collected without passing through the parasitic thyristor (regions of the n$_1^+$ layer 150 and n$_2^+$ layer 16) and a breakdown withstanding amount is improved.

Figure 12:
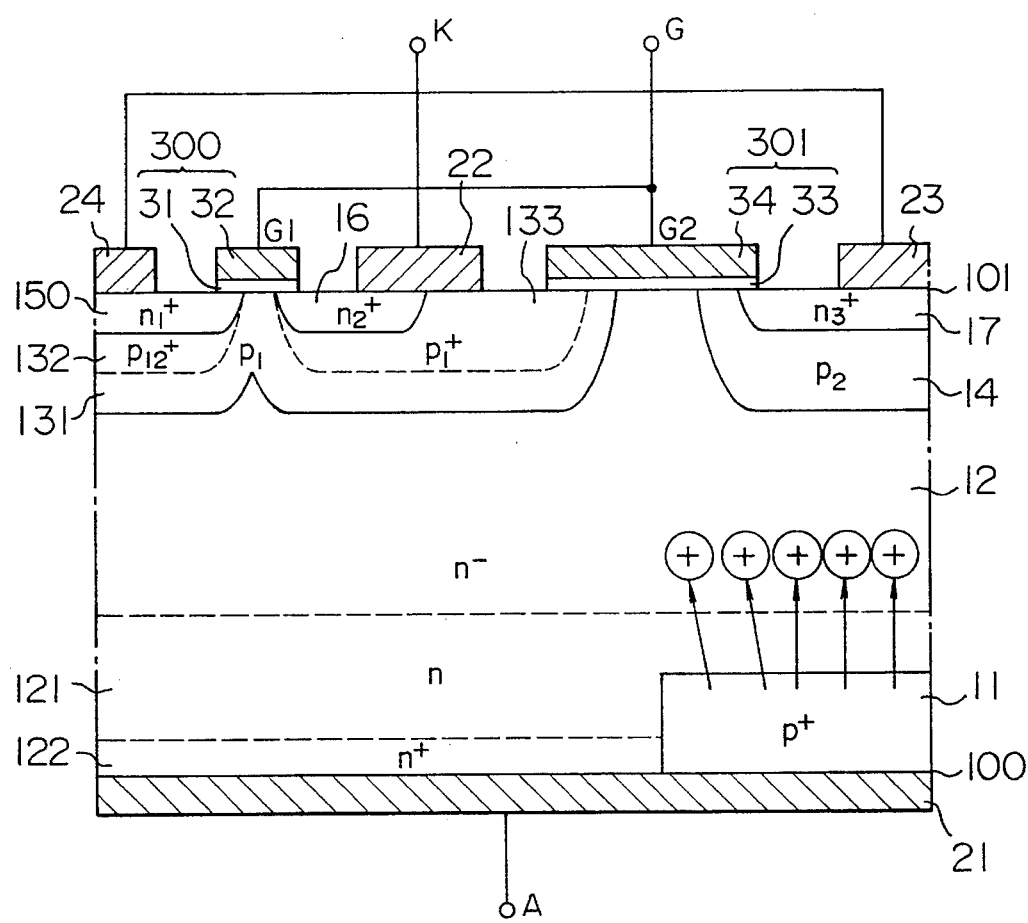
FIG. 12 is a schematic cross sectional view showing further another embodiment of a compound semiconductor device of the invention.

FIG. 12 shows further another embodiment of the invention in which an n layer 121 and the n$^+$ layer 122 for directly short-circuiting the n$^-$ layer 12 to the anode electrode 21 are provided on the anode side in FIG. 7. By providing the p$^+$ layer 11 to the region just under the n$_3^+$ layer 17, it becomes difficult for the holes ⊕ to reach the regions under the n$_1^+$ layer 150 and n$_2^+$ layer 16 where the parasitic thyristor exists and the latch-up of the parasitic thyristor can be certainly prevented. Further, since the excessive carriers caused by the implantation of the holes ⊕ from the p$^+$ layer 11 can be smoothly pulled out through the n layer 121 and n$^+$ layer 122 at the time of turn-off, the turn-off time can be also reduced. The n layer 121 functions as a stopper of the depletion layer extending in the n$^-$ layer 12, a film thickness of the n$^-$ layer can be made thin, and the ON voltage can be reduced.

In the compound semiconductor device according to the invention as described above, since the current can be turned on or off by the insulating gate, no malfunction occurs, so that a high performance of the electric power converting apparatus can be accomplished. FIG. 13 shows an embodiment of an inverting apparatus to control a motor in the case where the compound semiconductor device of the invention is used as a switching device. FIG. 13 shows a 3-phase inverting apparatus to control a 3-phase inductive motor IM and its fundamental circuit has a construction such that three serial circuits each comprising two switching devices are connected in parallel between DC terminals T$_1$ and T$_2$ and AC terminals T$_3$, T$_4$, and T$_5$ are led out from the middle points of those three serial circuits. Snubber circuits S each comprising a flywheel diode FD, a snubber diode SD, a snubber resistor SR, and a snubber capacitor SC are connected in parallel to switching devices SW$_1$, SW$_2$, SW$_3$, SW$_4$, SW$_5$, and SW$_6$. It is possible to realize an inverting apparatus of a high reliability in which the compound semiconductor device of the invention is used as a switching device and an ON/OFF circuit of the switching device is simplified.

According to the invention, in the thyristor which has a current limiting action and can be turned on or off by the MOS gate, since the potential of the p layer of the thyristor can be easily raised, the thyristor can easily ignite. On the other hand, since the hole current implanted from the p$^+$ layer can be led to the cathode electrode without passing through the parasitic thyristor, there is an effect such that a malfunction due to the latch-up of the parasitic thyristor doesn't occur. Further, since the p layer of the n channel MOSFET having the current limiting action and the p layer of the thyristor can be short-circuited by the p channel MOSFET, a high withstanding voltage can be easily realized. Further, by using the compound semiconductor device of the invention as a switching device of the electric power converting apparatus, the control circuit is simplified and the apparatus of a high reliability can be realized.

I claim:

1. An electric power converting apparatus in which a plurality of circuits are each formed by serially connecting at least a pair of switching devices between DC terminals, wherein a plurality of said circuits which is an integer times as large as the number of phases on an AC side of the electric power converting apparatus are connected in parallel and wherein AC terminals are led out from middle points of the switching devices which are serially connected to form said circuits, wherein each of said switching devices comprises:

a semiconductor substrate which is comprised of a first semiconductor region of a first conductivity type adjacent to a first main surface of the semiconductor substrate, a second semiconductor region of a second conductivity type that is adjacent to the first semiconductor region and a second main surface of the semiconductor substrate and which has a carrier density lower than that of the first semiconductor region, third and fourth semiconductor regions of the first conductivity type which extend from the second main surface into the second semiconductor region and which are separated from one another by the second semiconductor region and each of which has a carrier density higher than that of the second semiconductor region, a fifth semiconductor region of the second conductivity type which extends from the second main surface into the third semiconductor region and which has a carrier density higher than that of the third semiconductor region, sixth and seventh semiconductor regions of the second conductivity type which extend from the second main surface into the fourth semiconductor region and which are separated from one another by the fourth semiconductor region, and an eighth semiconductor region of the first conductivity type which connects the third semiconductor region with the fourth semiconductor region, wherein each of said sixth and seventh semiconductor regions has a carrier density higher than that of said second semiconductor region;

a first main electrode which is in ohmic contact with the first semiconductor region on the first main surface of the semiconductor substrate;

a second main electrode which is in ohmic contact with the fourth and seventh semiconductor regions on the second main surface of the semiconductor substrate;

a first insulating gate electrode provided on the second main surface of the semiconductor substrate so as to lie over the second, third, and fifth semiconductor regions;

a second insulating gate electrode provided on the second main surface of the semiconductor substrate so as to lie over the sixth, fourth, and seventh semiconductor regions;

first means for mutually electrically connecting the first and second insulating gate electrodes; and second means for mutually electrically connecting the fifth and sixth semiconductor regions, wherein the second means is not in contact with the third semiconductor region.

2. A semiconductor device in an electric power converting apparatus comprised of a plurality of circuits each of which include at least a pair of switching devices serially connected between DC terminals, wherein said plurality of circuits which correspond in number to the number of phases on an AC side associated with the power converting apparatus are connected in parallel, wherein AC terminals associated with the power converting apparatus are led out from midpoints of the serially connected switching devices of each of said plurality of circuits, and wherein each of said switching devices comprises:

a semiconductor substrate which is comprised of a first semiconductor region of a first conductivity type adjacent to a first main surface of the semiconductor substrate, a second semiconductor region of a second conductivity type that is adjacent to the first semiconductor region and a second main surface of the semiconductor substrate and which has a carrier density lower than that of the first semiconductor region, third and fourth semiconductor regions of the first conductivity type which extend from the second main surface into the second semiconductor region and which are separated from one another by the second semiconductor region and each of which has a carrier density higher than that of the second semiconductor region, a fifth semiconductor region of the second conductivity type which extends from the second main surface into the third semiconductor region and which has a carrier density higher than that of the third semiconductor region, sixth and seventh semiconductor regions of the second conductivity type which extend from the second main surface into the fourth semiconductor region and which are separated from one another by the fourth semiconductor region, and an eighth semiconductor region of the first conductivity type which connects the third semiconductor region with the fourth semiconductor region, wherein each of said sixth and seventh semiconductor regions has a carrier density higher than that of said second semiconductor region;

a first main electrode coupled to the first semiconductor region;

a second main electrode coupled to the fourth and seventh semiconductor regions;

a first insulating gate electrode provided on the second main surface of the semiconductor substrate so as to lie over the second, third, and fifth semiconductor regions;

a second insulating gate electrode provided on the second main surface of the semiconductor substrate so as to lie over the sixth, fourth, and seventh semiconductor regions;

first means for mutually electrically connecting the first and second insulating gate electrodes; and second means for mutually electrically connecting the fifth and sixth semiconductor regions, wherein the second means is not in contact with the third semiconductor region.

3. A semiconductor device in accordance with claim 2 wherein the first main electrode is in ohmic contact with the first semiconductor region on the first main surface of the semiconductor substrate and wherein the second main electrode is in ohmic contact with the fourth and seventh semiconductor regions on the second main surface of the semiconductor substrate.

4. A compound semiconductor device comprising:

A semiconductor substrate which is comprised of a first semiconductor region of a first conductivity type adjacent to a first main surface of the semiconductor substrate, a second semiconductor region of a second conductivity type which is adjacent to said first semiconductor region and to a second main surface of the semiconductor substrate and which has a carrier density lower than that of said first semiconductor region, third and fourth semiconductor regions of the first conductivity type which extend from the second main surface into said second semiconductor region and which are separated from one another by the second semiconductor region and each of which has a carrier density higher than that of the second semiconductor region, a fifth semiconductor region of the second conductivity type which extends from the second main surface into said third semiconductor region and which has a carrier density higher than that of said third semiconductor region, and sixth and seventh semiconductor regions of the second conductivity type which extend from the second main surface into said fourth semiconductor region and which are separated from one another by said fourth semiconductor region, an eighth semiconductor region of the first conductivity type which connects the third semiconductor region with the fourth semiconductor region, wherein each of said sixth and seventh regions has a carrier density higher than that of said second semiconductor region;

a first main electrode which is in ohmic contact with said first semiconductor region on the first main surface of the semiconductor substrate;

a second main electrode which is in ohmic contact with said fourth and seventh semiconductor regions on the second main surface of the semiconductor substrate;

a first insulating gate electrode provided on the second main surface of the semiconductor substrate so as to lie over the second, third, and fifth semiconductor regions;

a second insulating gate electrode provided on the second main surface of the semiconductor substrate so as to lie over the sixth, fourth, and seventh semiconductor regions;

first means for mutually electrically connecting said first and second insulating gate electrodes; and second means for mutually electrically connecting the fifth and sixth semiconductor regions, wherein the second means is not in contact with the third semiconductor region.

5. An electric power converting apparatus in which a plurality of circuits are each formed by serially connecting at least a pair of switching devices between DC terminals, wherein a plurality of said circuits which is an integer times as large as the number of phases on an AC side of the electric power converting apparatus are connected in parallel and wherein AC terminals are led out from middle points of the switching devices which are serially connected to form said circuits, wherein each of said switching devices comprises:

a semiconductor substrate wich is comprised of a first semiconductor region of a first conductivity type adjacent to a first main surface, a second semiconductor region of a second conductivity type which is adjacent to said first semiconductor region and to a second main surface and which has a carrier density lower than that of said first semiconductor region, third and fourth semiconductor regions of the first conductivity type which extend from the second main surface into said second semiconductor region and which are separated from one another by the second semiconductor region and each of which has a carrier density higher than that of the second semiconductor region, a fifth semiconductor region of the second conductivity type which extends from the second main surface into said third semiconductor region and which has a carrier density higher than that of said third semiconductor region, and sixth and seventh semiconductor regions of the second conductivity type which extend from the second main surface into said fourth semiconductor region and which are separated from one another by said fourth semiconductor region, wherein each of said sixth and seventh regions has a carrier density higher than that of said second semiconductor region;

a first main electrode which is in ohmic contact with said first semiconductor region on the first main surface of the semiconductor substrate;

a second main electrode which is in ohmic contact with said fourth and seventh semiconductor regions on the second main surface of the semiconductor substrate;

a first insulating gate electrode provided on the second main surface of the semiconductor substrate so as to lie over the second, third, and fifth semiconductor regions;

a second insulating gate electrode provided on the second main surface of the semiconductor substrate so as to lie over the sixth, fourth and seventh semiconductor regions;

first means for mutually electrically connecting said first and second insulating gate electrodes; and second means for mutually electrically connecting the fifth and sixth semiconductor regions, wherein the second means is not in contact with the third semiconductor region.

\* \* \* \* \*